(12) United States Patent  
Shimamura et al.

(10) Patent No.: US 8,897,019 B1  
(45) Date of Patent: Nov. 25, 2014

(54) CIRCUIT MODULE

(71) Applicant: Taiyo Yuden Co., Ltd., Tokyo (JP)

(72) Inventors: Masaya Shimamura, Tokyo (JP); Kenzo Kitazaki, Tokyo (JP); Eiji Mugiya, Tokyo (JP); Tetsuo Saji, Tokyo (JP); Atsushi Tsunoda, Tokyo (JP); Hiroshi Nakamura, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 14/103,620

(22) Filed: Dec. 11, 2013

(30) Foreign Application Priority Data

Aug. 19, 2013 (JP) ................................. 2013-169616

(51) Int. Cl.
*H05K 7/00* (2006.01)
*H05K 9/00* (2006.01)

(52) U.S. Cl.
CPC .................................... *H05K 9/0015* (2013.01)
USPC ............................ 361/728; 361/799; 361/816

(58) Field of Classification Search
USPC ......... 361/799, 816, 818, 760, 721, 728–730; 174/261–262, 265
See application file for complete search history.

(56) References Cited

U.S. PATENT DOCUMENTS

| | | | | |
|---|---|---|---|---|
| 7,180,012 B2* | 2/2007 | Tsuneoka et al. | ............. | 174/521 |
| 8,093,691 B1* | 1/2012 | Fuentes et al. | ................ | 257/660 |
| 8,212,340 B2* | 7/2012 | Liao | ............... | 257/660 |
| 8,592,958 B2* | 11/2013 | Ko et al. | ........................ | 257/660 |
| 8,654,537 B2* | 2/2014 | Fisher et al. | .................. | 361/750 |
| 2006/0258050 A1 | 11/2006 | Fujiwara et al. | | |
| 2012/0000699 A1 | 1/2012 | Inoue | | |

FOREIGN PATENT DOCUMENTS

| | | |
|---|---|---|
| JP | 2005-317935 A | 11/2005 |
| JP | 2010-225620 A | 10/2010 |

OTHER PUBLICATIONS

Office Action issued in corresponding Japanese Application No. 2013-171761 dated Oct. 1, 2013 and English translation of the same (4 pages).
Office Action issued in corresponding Japanese Application No. 2013-171761 dated Dec. 3, 2013 and English translation of the same (4 pages).

* cited by examiner

*Primary Examiner* — Hung S Bui
(74) *Attorney, Agent, or Firm* — Fitch Even Tabin & Flannery, LLP

(57) ABSTRACT

There is provided a circuit module, including: a circuit substrate including a mount surface; a mounting component mounted on the mount surface; a sealing body that is formed on the mount surface, covers the mounting component, and includes a trench formed from a main surface of the sealing body toward the mount surface, the trench including a first trench portion extending in one of a parallel direction and an orthogonal direction with respect to a direction parallel to the main surface and a second trench portion that is connected to the first trench portion, is parallel to the main surface, and extends in a direction that is not parallel nor orthogonal to the first trench portion; and a shield that covers the sealing body and includes an inner shield portion formed inside the trench and an outer shield portion provided on the main surface and the inner shield portion.

3 Claims, 16 Drawing Sheets

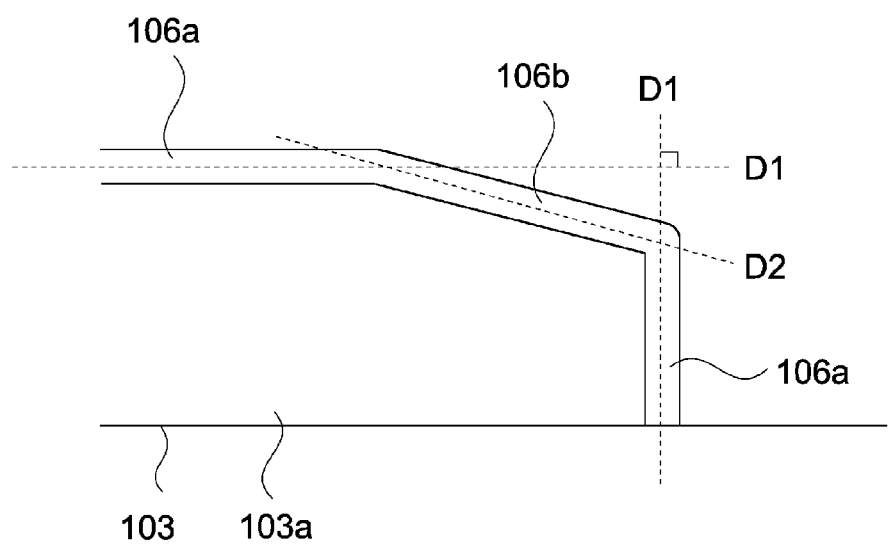
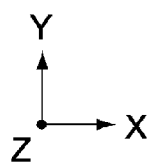
FIG.8

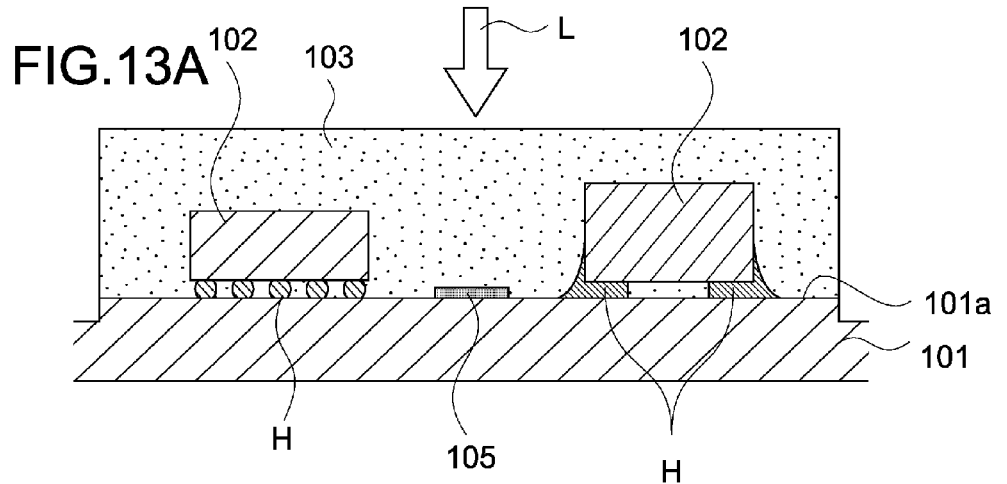
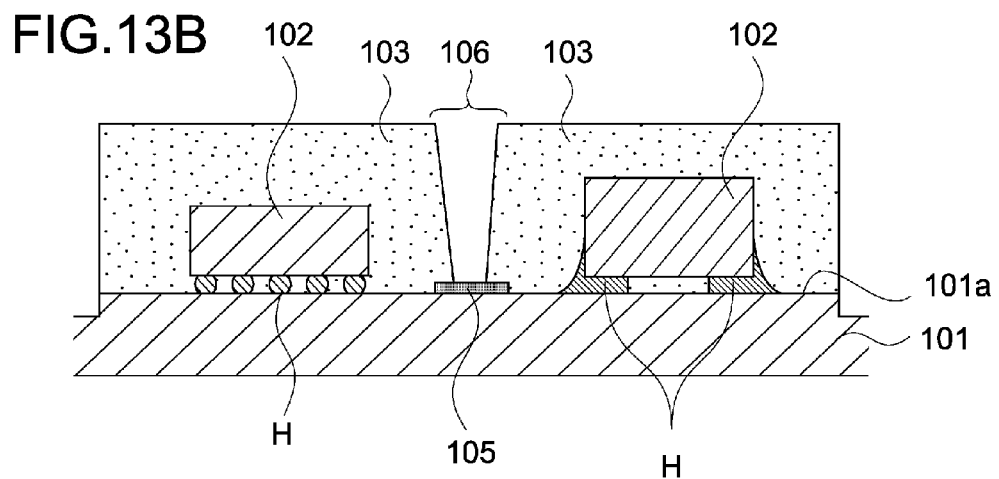
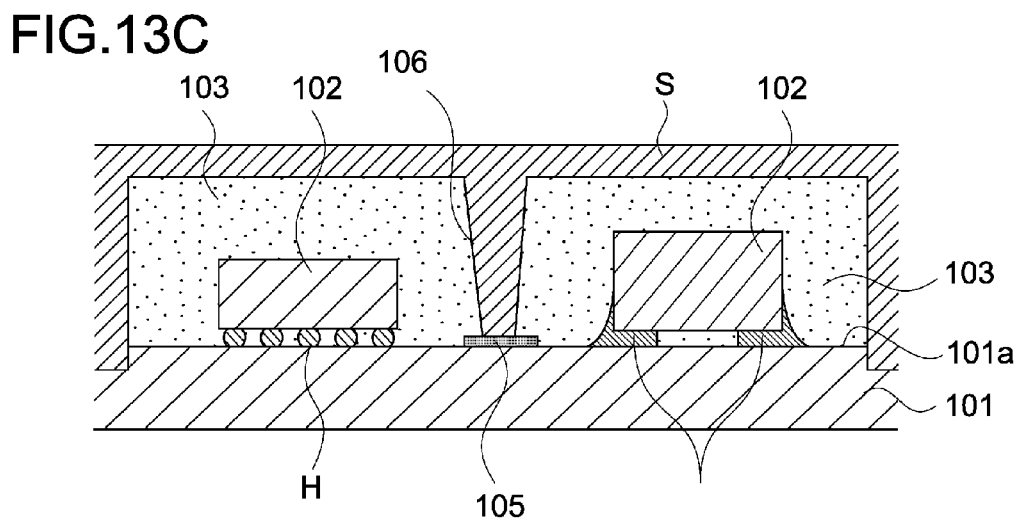

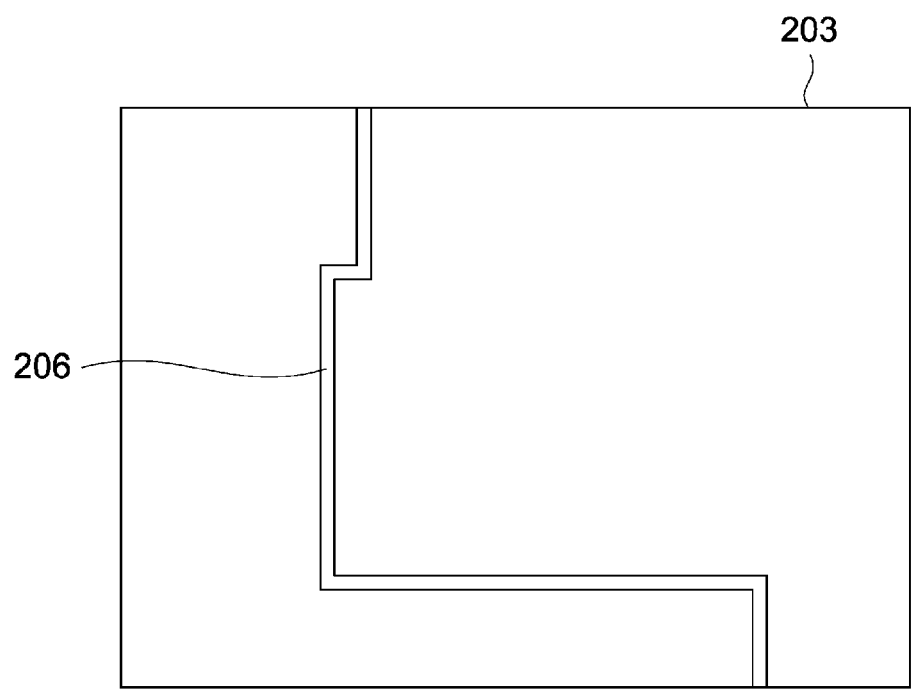
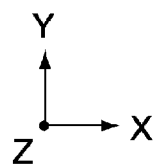
FIG.14

CIRCUIT MODULE

CROSS-REFERENCE TO A RELATED APPLICATION

This application claims priority under 35 U.S.C. §119 to Japanese Patent Application No. JP 2013-169616 filed on Aug. 19, 2013, the entire content of which is hereby incorporated herein by reference in its entirety

FIELD

The present disclosure relates to a circuit module in which a mounting component is mounted and sealed on a circuit substrate.

BACKGROUND

A circuit module in which a periphery of a mounting component mounted on a circuit substrate is sealed by a sealing body formed of a synthetic resin or the like is used. Here, when the mounting component is a wireless communication device, for example, a surface of the sealing body is covered with a conductive body that is to be used as a shield against a failure due to electromagnetic waves (hereinafter, referred to as electromagnetic failure). Examples of the electromagnetic failure include an interference and an unnecessary radiation. By providing the shield, an electromagnetic failure with respect to an electronic apparatus outside the shield, that is due to electromagnetic waves generated from a mounting component inside the shield, is prevented from occurring (emission improvement), and an electromagnetic failure due to electromagnetic waves from outside the shield with respect to a mounting component inside the shield is prevented from occurring (immunity improvement).

Further, a circuit module in which a shield is provided to separate, when a plurality of mounting components are mounted on a circuit substrate, the mounting components from one another for preventing an electromagnetic failure from occurring among the mounting components is being developed. Since the mounting components are covered by the sealing body as described above, the shield provided among the mounting components can be formed by partially removing the sealing body to form a trench (groove) and forming a conductive body inside the trench. The conductive body can be formed by, for example, filling a conductive resin paste inside the trench.

For example, Patent Document 1 discloses a circuit module in which a shield among electronic components is formed by forming a slit on a mold resin layer and filling a conductive resin inside the slit.

Patent Document 1: Japanese Patent Application Laid-open No. 2010-225620

SUMMARY

As described above, the trench is formed so as to separate the mounting components as a shield target, that is, a line shape of the trench (shape of trench seen in direction vertical to main surface of sealing body) is limited by a layout of the mounting components. As the circuit module is miniaturized and the mounting components are mounted at a high density, it becomes difficult to form the trench among the mounting components as the shield target.

In view of the circumstances as described above, there is a need for a circuit module that is suitable for a miniaturization and is capable of effectively preventing an electromagnetic failure from occurring.

According to an embodiment of the present disclosure, there is provided a circuit module including a circuit substrate, a mounting component, a sealing body, and a shield.

The circuit substrate includes a mount surface.

The mounting component is mounted on the mount surface.

The sealing body is formed on the mount surface, covers the mounting component, and includes a trench formed from a main surface of the sealing body toward the mount surface, the trench including a first trench portion extending in one of a parallel direction and an orthogonal direction with respect to a direction parallel to the main surface and a second trench portion that is connected to the first trench portion, is parallel to the main surface, and extends in a direction that is not parallel nor orthogonal to the first trench portion.

The shield covers the sealing body and includes an inner shield portion formed inside the trench and an outer shield portion provided on the main surface and the inner shield portion.

BRIEF DESCRIPTION OF THE DRAWINGS

FIG. 8 is an enlarged plan view showing the trench shape of the circuit module;

FIGS. 13A-13C are schematic diagrams showing the method of producing a circuit module;

FIG. 14 is a plan view showing a sealing body of a circuit module according to a comparative example;

DETAILED DESCRIPTION OF EMBODIMENTS

Figure 1:
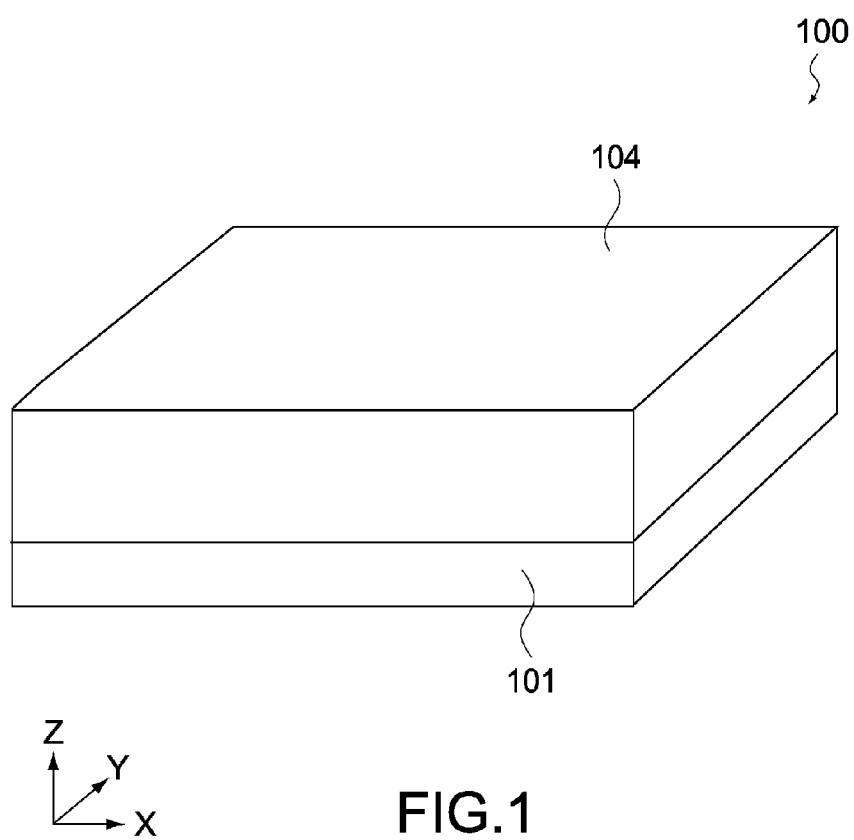
FIG. 1 is a perspective view of a circuit module according to an embodiment of the present disclosure.

According to an embodiment of the present disclosure, there is provided a circuit module including a circuit substrate, a mounting component, a sealing body, and a shield.

The circuit substrate includes a mount surface.

The mounting component is mounted on the mount surface.

The sealing body is formed on the mount surface, covers the mounting component, and includes a trench formed from a main surface of the sealing body toward the mount surface, the trench including a first trench portion extending in one of a parallel direction and an orthogonal direction with respect to a direction parallel to the main surface and a second trench portion that is connected to the first trench portion, is parallel to the main surface, and extends in a direction that is not parallel nor orthogonal to the first trench portion.

The shield covers the sealing body and includes an inner shield portion formed inside the trench and an outer shield portion provided on the main surface and the inner shield portion.

With this structure, it becomes easier to keep a distance between the mounting component and the trench than in a case where the trench extends only in one direction or a direction orthogonal to that direction, and a degree of freedom regarding a mounting layout can be improved. Further, by increasing a distance between the inner shield portion formed inside the trench and the mounting component, the inner shield portion and the mounting component can be prevented from short-circuiting, and a production yield of the circuit module is improved. Furthermore, it is also possible to shorten the trench and save time required for forming the trench and a material for the inner shield portion.

The trench may include a plurality of first trench portions provided apart from each other, and the second trench portion may connect a gap between the plurality of first trench portions.

When the trench includes a portion that is bent orthogonally, there is a fear that a lower layer structure (surface layer conductor, in-layer wiring, etc.) of the sealing body at the orthogonally-bent portion will be damaged due to a laser irradiation for forming the trench. With the structure described above, since the first trench portions are connected by the second trench portion, that is, the trench cannot be bent orthogonally, the lower layer structure can be prevented from being damaged by the laser irradiation.

The mounting component may include a plurality of mounting components, and the trench may be formed to separate the plurality of mounting components.

With this structure, it is possible to effectively prevent an electromagnetic failure from occurring among the mounting components by the inner shield portion formed inside the trench. Moreover, since the degree of freedom regarding the mounting layout is improved in the circuit module according to this embodiment as described above, the plurality of mounting components can be mounted with a high density.

The circuit module according to the embodiment of the present disclosure will be described.
(Structure of Circuit Module)

FIG. 1 is a perspective view of a circuit module 100 according to this embodiment.

Figure 2:
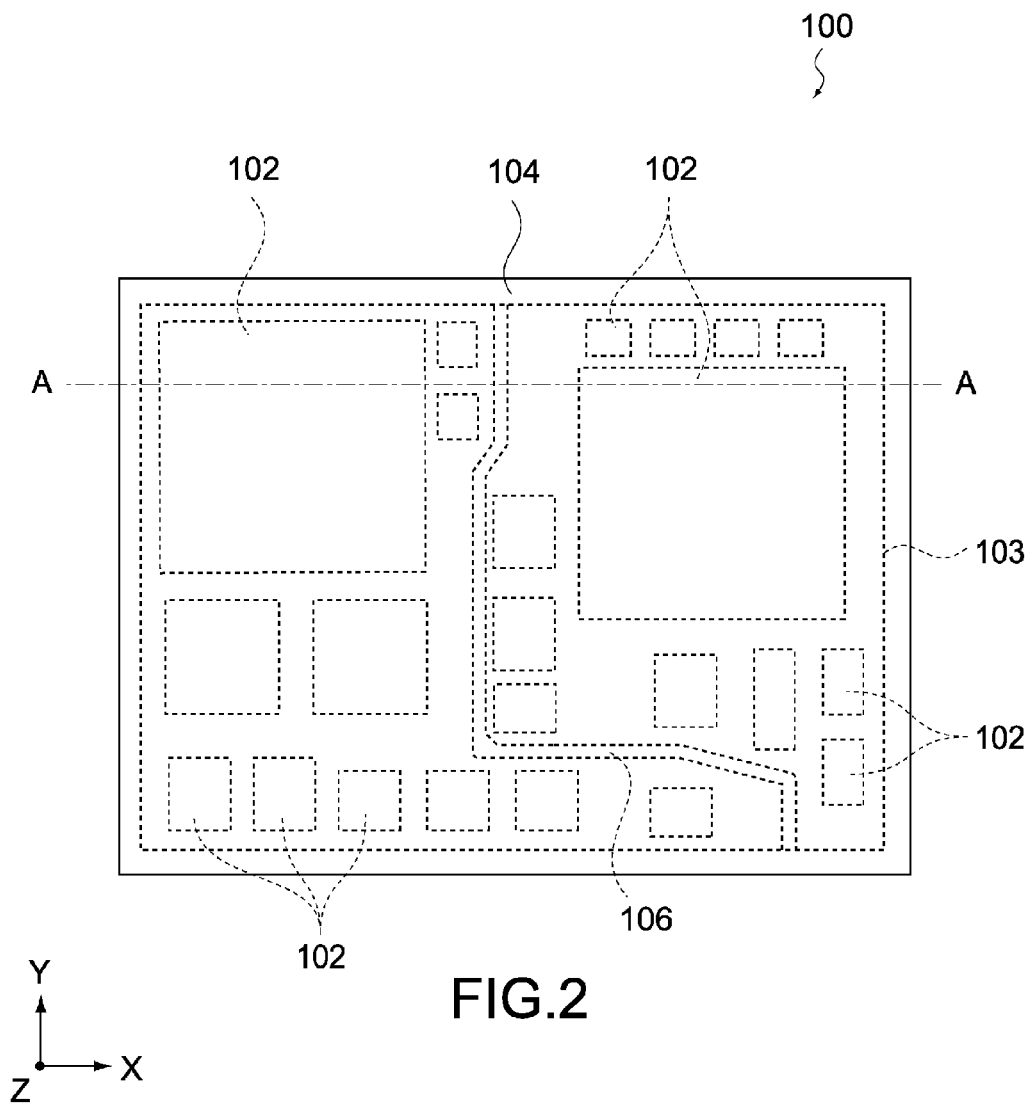
FIG. 2 is a plan view of the circuit module.
Figure 3:
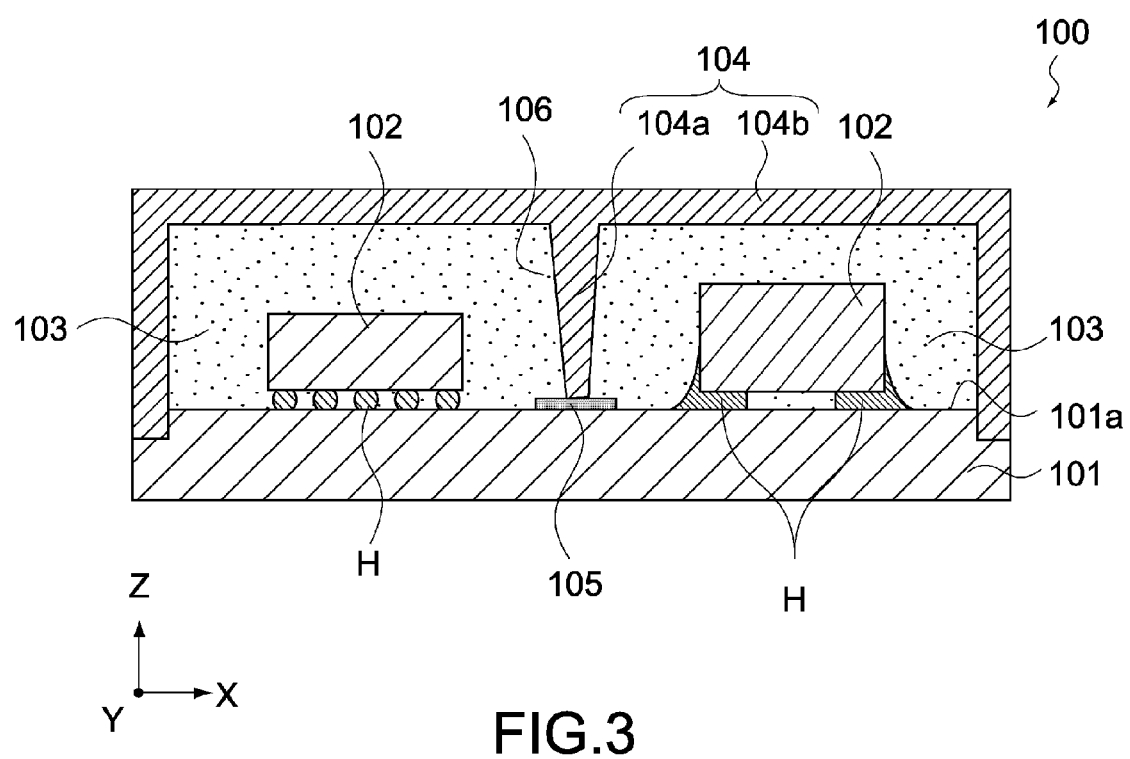
FIG. 3 is a cross-sectional diagram of the circuit module.

FIG. 2 is a plan view of the circuit module 100. FIG. 3 is a cross-sectional diagram of the circuit module 100 taken along the line A-A of FIG. 2. It should be noted that in the figures, X, Y, and Z directions are mutually orthogonal.

As shown in FIGS. 1 to 3, the circuit module 100 includes a circuit substrate 101, mounting components 102, a sealing body 103, and a shield 104. The size and shape of the circuit module 100 are not particularly limited and may be a several-ten mm square cuboid having a thickness of several mm, for example. The X direction is parallel to long sides of the circuit module 100, and the Y direction is parallel to short sides of the circuit module 100. The Z direction is a thickness direction of the circuit module 100.

The circuit substrate 101 is a substrate on which the mounting components 102 and the like are mounted. The circuit substrate 101 may be a multilayer substrate in which layers formed of a glass epoxy material or an insulation material such as an insulation ceramic material are laminated, and in-layer wirings (not shown) may be formed in the layers. Hereinafter, a surface of the circuit substrate 101 on a side on which the mounting components 102 are mounted will be referred to as mount surface 101a.

On the mount surface 101a, a surface layer conductor 105 is formed as shown in FIG. 3. The surface layer conductor 105 is formed of a conductive material and may be a plated film formed by performing copper plating on the mount surface 101a or a copper foil adhered onto the mount surface 101a, for example. Further, the surface layer conductor 105 may be formed by, for example, applying a liquid-type metal paste onto the mount surface 101a and solidifying the applied metal paste by calcination. Alternatively, the surface layer conductor 105 may be formed by applying a liquid-type conductive resin paste and curing the applied conductive resin paste. The surface layer conductor 105 may be provided along a trench 106 to be described later on the mount surface 101a.

The surface layer conductor 105 is connected to the in-layer wiring formed in the circuit substrate 101 and electrically connected to the mounting components 102 via the in-layer wiring. Specifically, the surface layer conductor 105 is electrically connected to a ground terminal of the circuit module 100, that is, the surface layer conductor 105 has the same potential as a ground potential of the circuit module 100.

The mounting components 102 are components mounted on the mount surface 101a of the circuit substrate 101, examples of which include an integrated circuit (IC), a capacitor, an inductor, a resistor, a crystal oscillator, a duplexer, a filter, and a power amplifier. The mounting components 102 are mounted on the mount surface 101a by being bonded by a solder H. As shown in FIG. 2, a plurality of mounting components 102 can be mounted on the circuit substrate 101. It should be noted that the number of mounting components 102 and a layout thereof are not particularly limited.

The sealing body 103 is formed of a sealing material and covers the mounting components 102 on the mount surface 101a. An example of the sealing material is an insulation resin such as an epoxy resin to which silica or alumina is added. After the mounting components 102 are mounted on the mount surface 101a, the fluid-type sealing material is filled in the periphery of the mounting components 102 and cured to thus form the sealing body 103.

Figure 4:
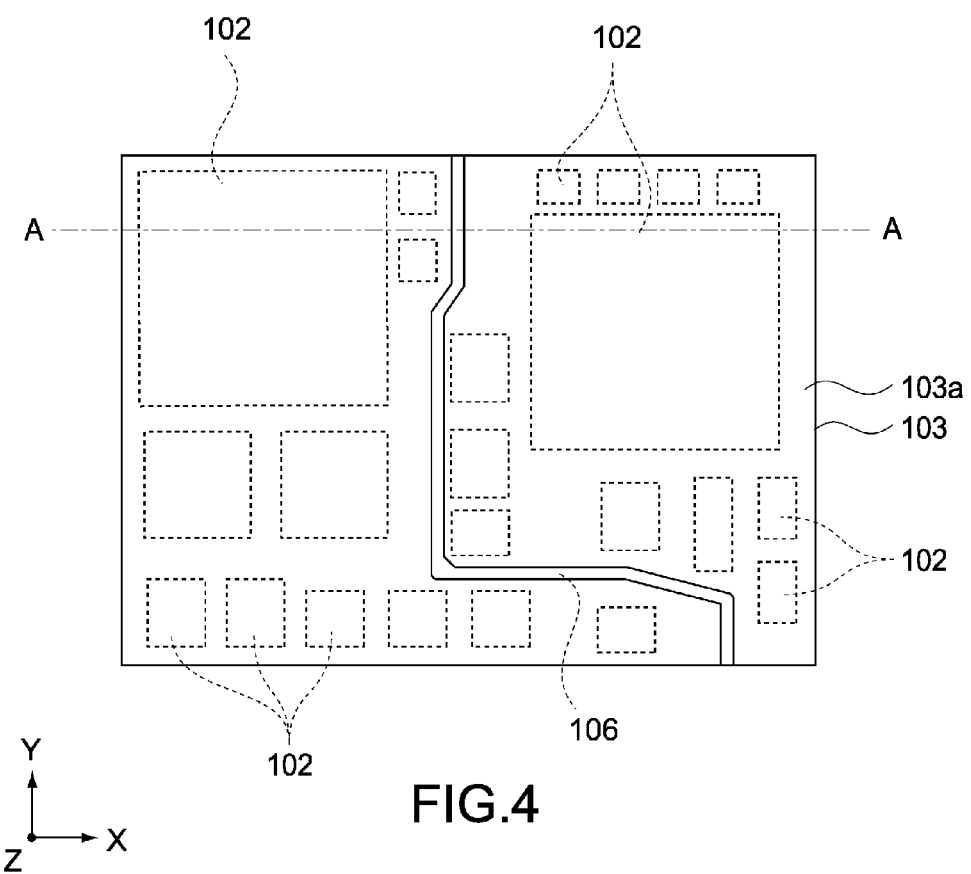
FIG. 4 is a plan view of a sealing body of the circuit module.
Figure 5:
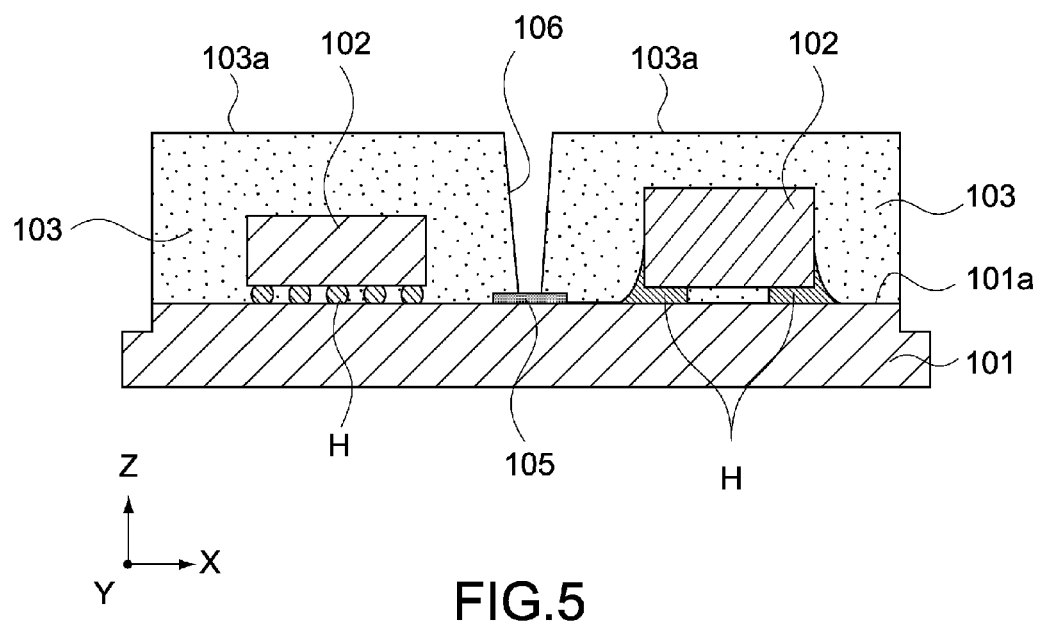
FIG. 5 is a cross-sectional diagram showing the sealing body of the circuit module.

FIG. 4 is a plan view of the sealing body 103, and in the figure, the shield 104 shown in FIG. 2 is not illustrated. FIG. 5 is a cross-sectional diagram showing the sealing body 103, and in the figure, the shield 104 shown in FIG. 3 is not illustrated. As shown in the figures, the trench 106 is formed on the sealing body 103. Hereinafter, a main surface of the sealing body 103 will be referred to as main surface 103a.

The trench 106 is formed by removing the sealing body 103 in a groove-shape from the main surface 103a toward the mount surface 101a. The method of forming the trench 106 and details of the trench 106 will be described later. The trench 106 is formed among the plurality of mounting components 102 so as to separate the mounting components 102 as shown in FIG. 4.

The shield 104 is formed of a shield material that is a conductive material and functions as a shield with respect to an electromagnetic failure. The shield material may be, for example, a conductive resin such as an epoxy resin including conductive particles of Ag, Cu, and the like, and the shield 104 may be a metal film formed on the sealing body 103 by plating or the like.

As shown in FIG. 3, the shield 104 includes an inner shield portion 104a and an outer shield portion 104b. The inner shield portion 104a is formed inside the trench 106 and is brought into contact with and electrically connected to the surface layer conductor 105 via the trench 106.

The outer shield portion 104b is provided above the main surface 103a of the sealing body 103 (see FIG. 5) and the inner shield portion 104a. The outer shield portion 104b is continuous with the inner shield portion 104a and electrically connected to the surface layer conductor 105 via the inner shield portion 104a. As described above, the surface layer conductor 105 is connected to the ground terminal of the circuit module 100, and the shield 104 has a ground potential.

The circuit module 100 has the overall structure as described above. In the circuit module 100, an electromagnetic failure is prevented from occurring by the shield 104. Specifically, an electromagnetic failure with respect to the mounting components 102 from outside the circuit module 100 and an electromagnetic failure with respect to the outside of the circuit module 100 from the mounting components 102 are prevented by the outer shield portion 104b. In addition, an electromagnetic failure among the mounting components 102 is prevented by the inner shield portion 104a.

(Trench)

Figure 6:
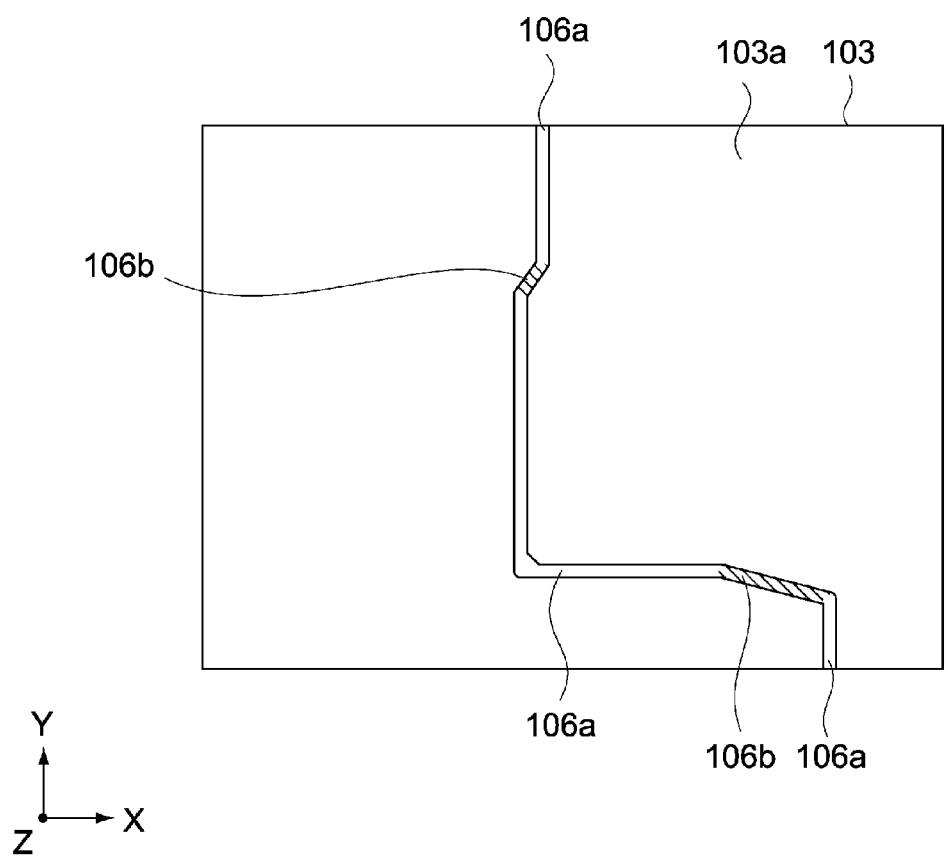
FIG. 6 is a plan view showing a trench shape of the circuit module.
Figure 7:
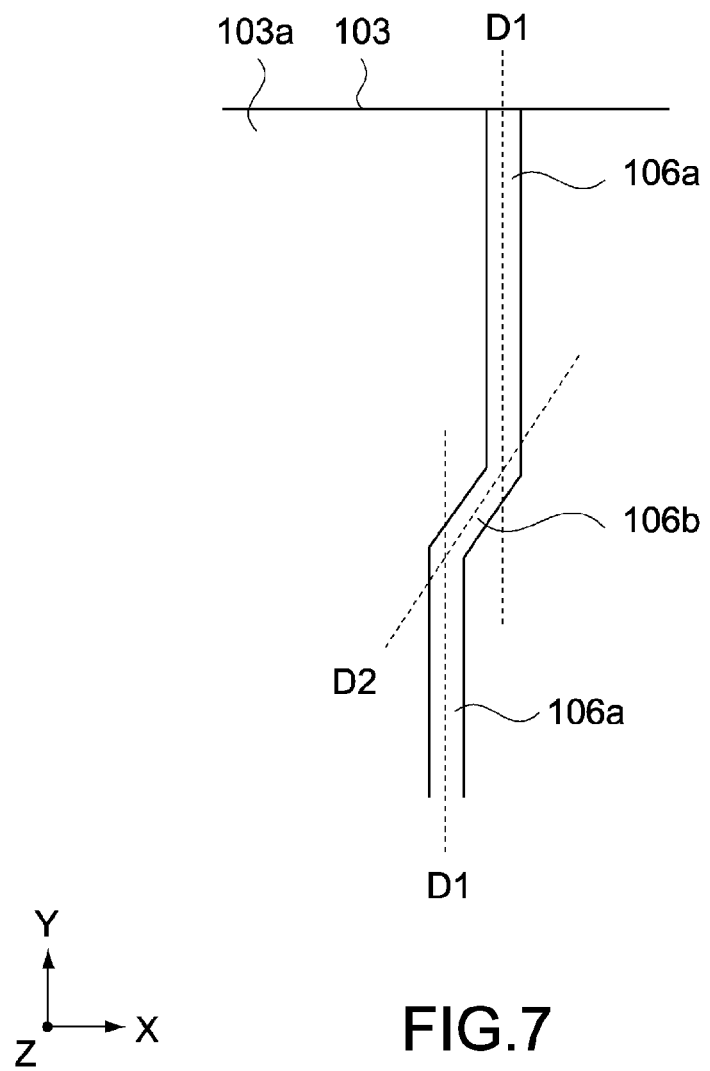
FIG. 7 is an enlarged plan view showing the trench shape of the circuit module.

The shape of the trench 106 will be described. FIG. 6 is a plan view of the sealing body 103 showing the shape of the trench 106, and FIGS. 7 and 8 are partially-enlarged views of FIG. 6. As shown in FIG. 6, the trench 106 includes first trench portions 106a and second trench portions 106b when seen in a direction vertical to the main surface 103a (Z direction). In the figure, the second trench portions 106b are hatched.

Of the trench 106, the first trench portions 106a are portions that extend in a direction parallel (Y direction) or orthogonal (X direction) to a direction parallel to the main surface 103a (Y direction herein). In FIGS. 7 and 8, the direction in which the first trench portions 106a extend is indicated by lines D1. The first trench portions 106a shown in FIG. 7 extend in the Y direction, and the first trench portions 106a shown in FIG. 8 extend in both the Y and X directions. The trench 106 may include a plurality of first trench portions 106a provided apart from one another (separated by second trench portions 106b) as shown in FIG. 6 or may include only one first trench portion 106a.

Of the trench 106, the second trench portion 106b is a portion that is parallel to the main surface 103a but extends in a direction neither parallel nor orthogonal to the first trench portion 106a. The second trench portion 106b is connected to the first trench portion 106a. In FIGS. 7 and 8, the directions in which the second trench portions 106b extend are indicated by lines D2. Here, since the first trench portions 106a extend in the X and Y directions, the second trench portions 106b extend in directions different from the X and Y directions. It should be noted that even when the trench 106 includes a plurality of second trench portions 106b as shown in FIG. 6, the extension directions do not need to be parallel.

Figure 9:
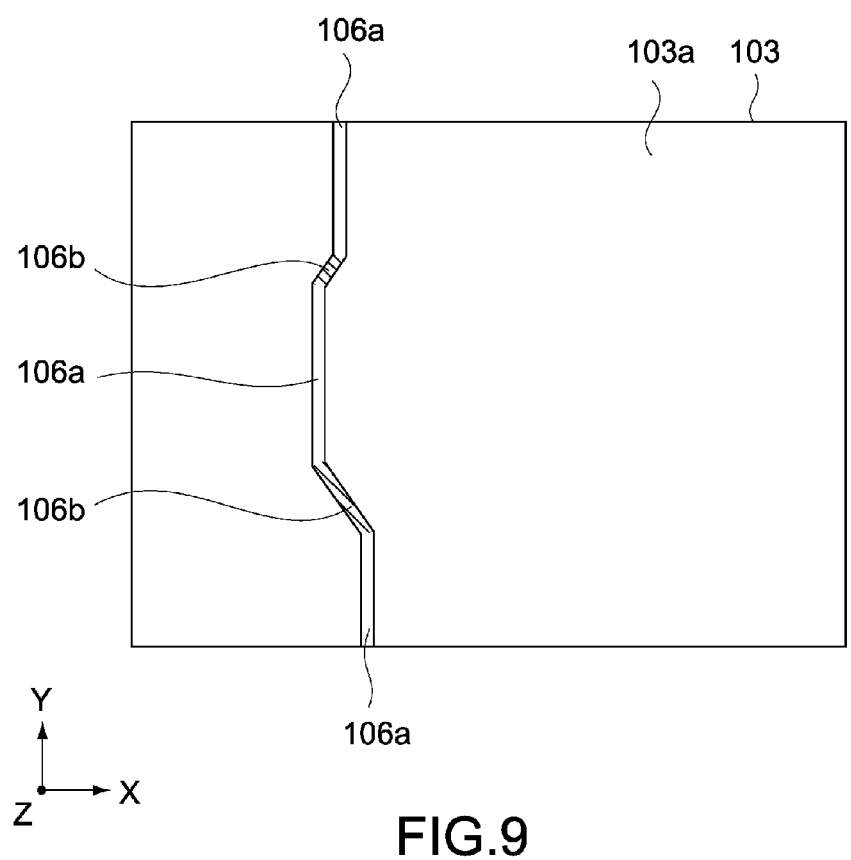
FIG. 9 is a plan view showing the trench shape of the circuit module.
Figure 10:
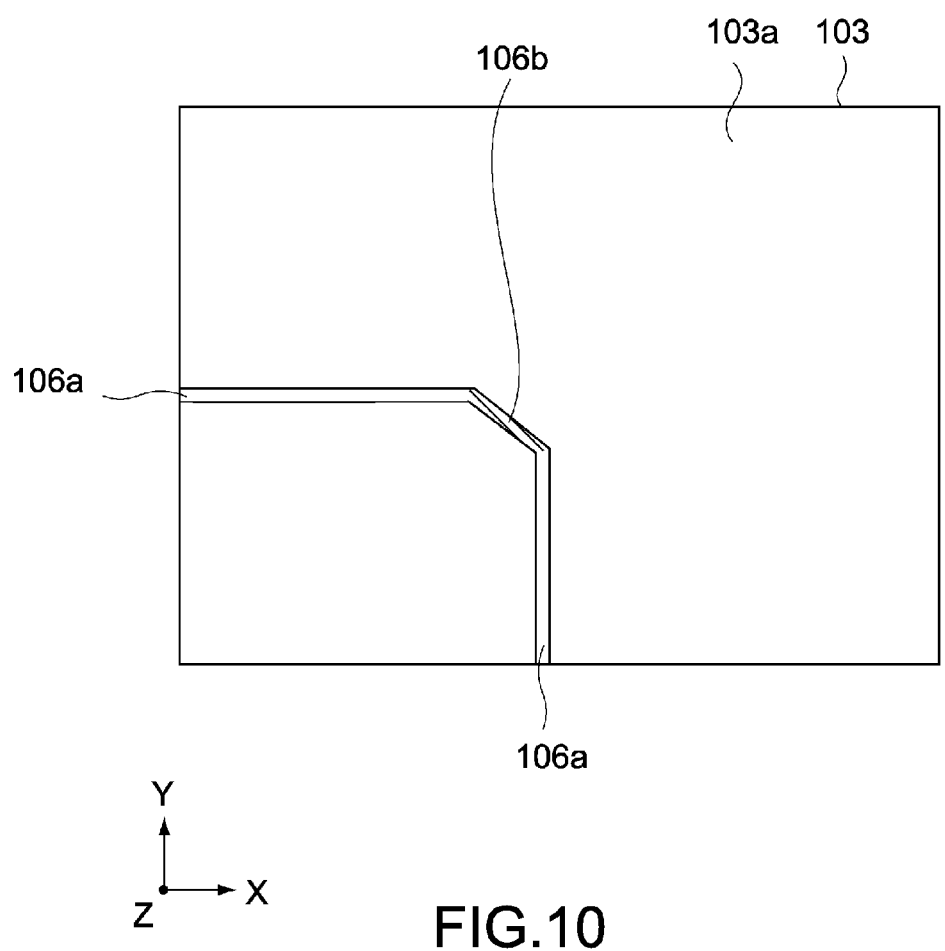
FIG. 10 is a plan view showing the trench shape of the circuit module.

The first trench portions 106a may extend only in the direction parallel to a direction parallel to the main surface 103a. FIG. 9 is a plan view of the sealing body 103, that shows the first trench portions 106a extending in only the direction parallel to one direction (Y direction herein). Similarly, the first trench portions 106a may extend in the direction orthogonal to the direction parallel to the main surface 103a and not include a portion extending in the parallel direction. FIG. 10 is a plan view of the sealing body 103, that shows the first trench portions 106a extending in mutually-orthogonal directions (X and Y directions herein).

Figure 11:
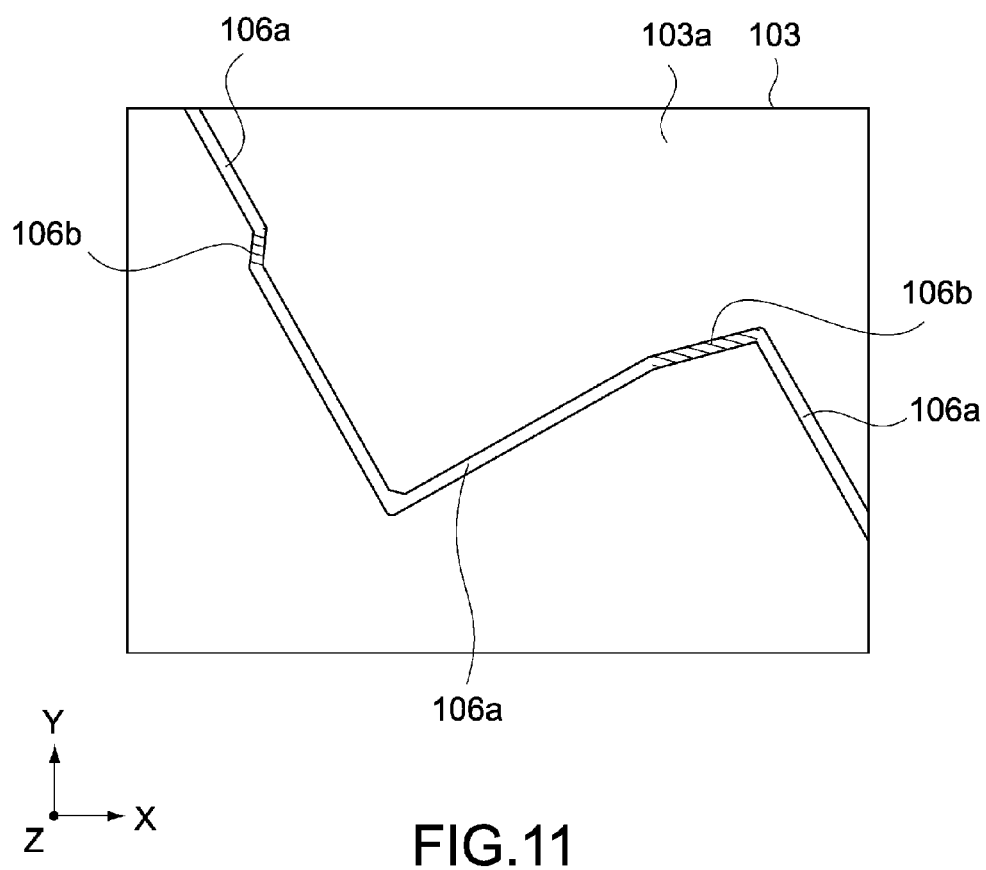
FIG. 11 is a plan view showing the trench shape of the circuit module.

It should be noted that the first trench portions 106a are not limited to portions that extend in the Y and X directions and may be portions that extend in the direction parallel to the main surface 103a and a direction orthogonal to that direction. FIG. 11 is a plan view of the sealing body 103, that shows the first trench portions 106a extending in directions different from the X and Y directions. Also in this case, the second trench portions 106b (hatched ranges) extend in directions that are not parallel nor orthogonal to the first trench portions 106a.

(Method of Producing Circuit Module)

A method of producing the circuit module 100 will be described. FIGS. 12 and 13 are schematic diagrams showing the method of producing the circuit module 100. It should be noted that a plurality of circuit modules 100 are produced on a single circuit substrate at the same time and divided into each circuit module 100. Descriptions below will be given on one of the circuit modules 100.

Figure 12A:
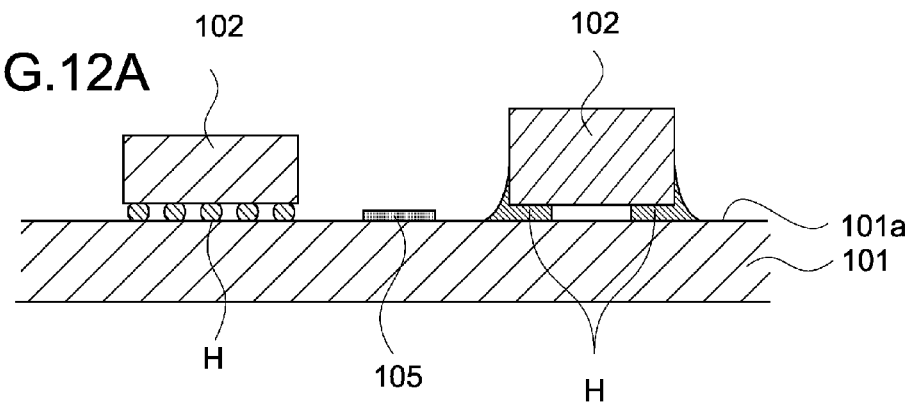
FIGS. 12A-12C are schematic diagrams showing a method of producing a circuit module.

As shown in FIG. 12A, the mounting components 102 are mounted on the mount surface 101a of the circuit substrate 101. The mounting can be performed by various mounting methods such as solder bonding. It should be noted that the surface layer conductor 105 is provided on the mount surface 101a in advance.

Figure 12B:
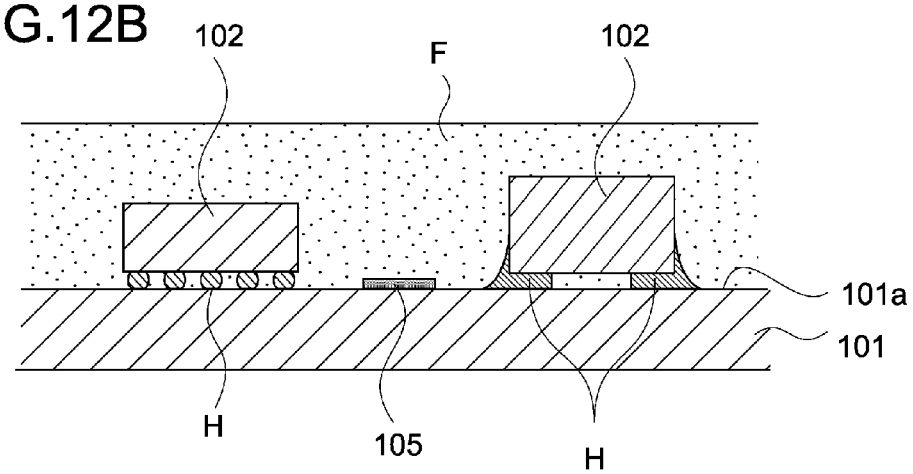

Subsequently, as shown in FIG. 12B, a sealing material F is applied onto the mount surface 101a so as to cover the mounting components 102. The sealing material F can be applied by, for example, vacuum printing. After that, the sealing material F is cured to form the sealing body 103 formed of the sealing material F. The sealing material F can be cured by, for example, baking.

Figure 12C:
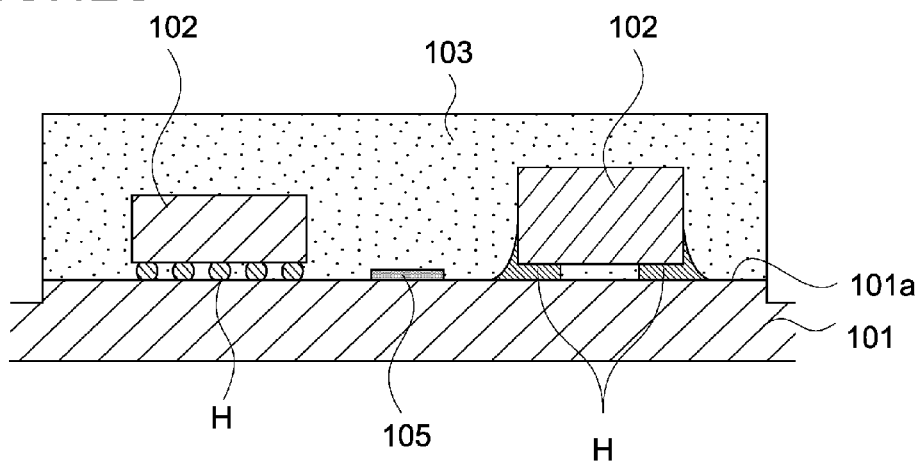

Next, as shown in FIG. 12C, the sealing body 103 is half-cut for each circuit module 100. The half-cut of the sealing body 103 can be performed using, for example, a dicer.

Then, as shown in FIG. 13A, a laser L is irradiated onto and scans the sealing body 103. The sealing body 103 is removed linearly by the irradiation of the laser L to form the trench 106 as shown in FIG. 13B. At this time, by controlling a scanning path of the laser L, the trench 106 including the first trench portions 106a and the second trench portions 106b as shown in FIGS. 6 to 11 can be formed.

Subsequently, as shown in FIG. 13C, a shield material S is provided above the sealing body 103. The shield material S can be provided by applying a conductive resin paste on the sealing body 103. At this time, the shield material S is filled inside the trench 106. After that, the shield material S is cured by baking or the like to obtain the shield 104.

Then, the shield 104 and the circuit substrate 101 are cut (full-cut) for each circuit module 100. The cut of the shield 104 and the circuit substrate 101 can be performed using, for example, a dicer. After that, the shield material S is cured by baking or the like to obtain the shield 104. Accordingly, the circuit module 100 is produced as shown in FIG. 3. As described above, since the shield material S is provided above the sealing body 103 after the trench 106 is formed on the sealing body 103, the shape of the inner shield portion 104a is determined based on the shape of the trench 106.

(Effect)

An effect of the circuit module 100 according to this embodiment will be described. FIG. 14 is a plan view showing a sealing body 203 of a circuit module 200, that shows a trench 206 of the circuit module 200 according to a comparative example. As shown in the figure, the trench 206 of the circuit module 200 extends only in a direction parallel to a main surface of the sealing body 203 and a direction orthogonal to that direction, that is, the trench 206 is constituted of only portions corresponding to the first trench portions 106a according to this embodiment.

Figure 15:
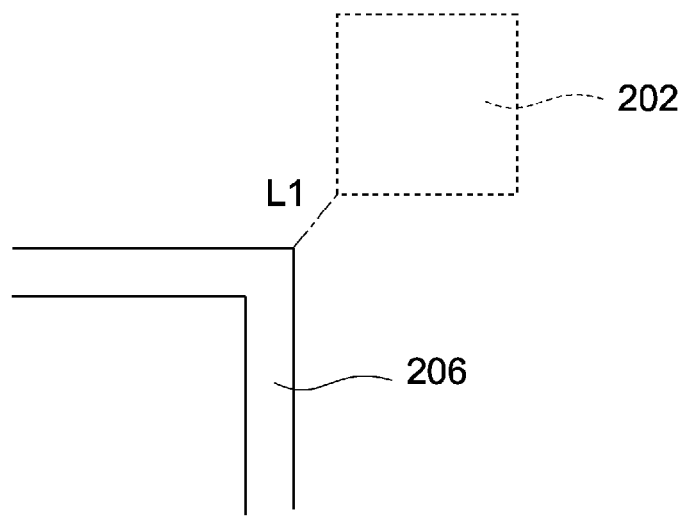
FIG. 15 is a schematic diagram showing a trench of the circuit module and a mounting component according to the comparative example.
Figure 16:
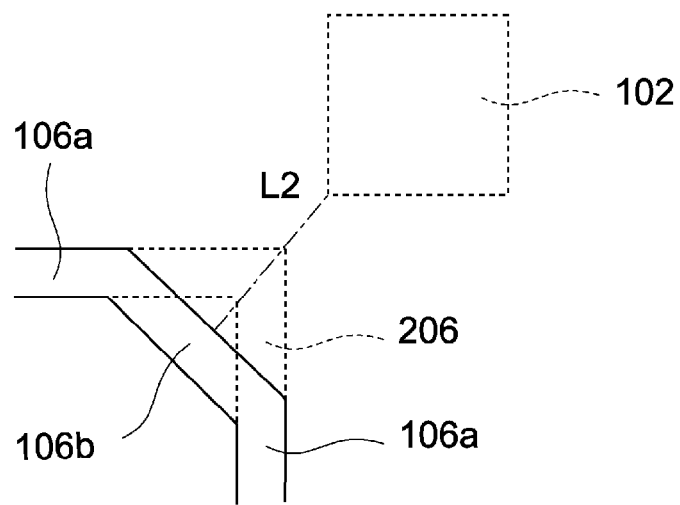
FIG. 16 is a schematic diagram showing a trench of the circuit module and a mounting component according to the embodiment of the present disclosure.

In the circuit module 100 of this embodiment, the degree of freedom regarding the mounting layout of the mounting components 102 is higher than that of the circuit module 200. FIG. 15 is a schematic diagram showing a distance between the trench 206 and a mounting component 202 in the circuit module 200. FIG. 16 is a schematic diagram showing a distance between the trench 106 and the mounting component 102 in the circuit module 100.

The distance between the trench 206 and the mounting component 202 in the circuit module 200 is a distance L1 as shown in FIG. 15, and the distance between the trench 106 and the mounting component 102 in the circuit module 100 is a distance L2 as shown in FIG. 16. It should be noted that in FIG. 16, the trench 206 overlapping the trench 106 is indicated by broken lines. As shown in FIGS. 15 and 16, the distance L2 can be made larger than the distance L1 by providing the second trench portion 106b.

Accordingly, the mounting components 102 can be prevented from being exposed inside the trench 106 in producing the circuit module 100, and a process yield in the production of the circuit module 100 is improved. Furthermore, since a distance between the inner shield portion 104a formed inside the trench 106 and the mounting components 102 can be maintained, a short circuit can be prevented from occurring between those components.

Figure 17:
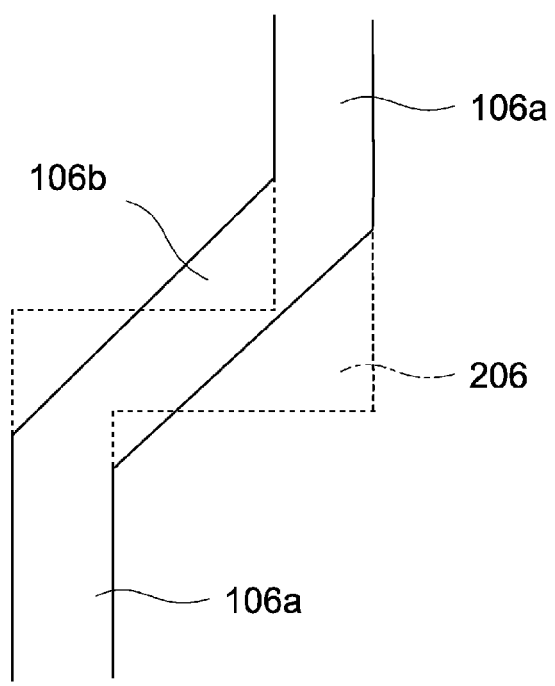
FIG. 17 is a schematic diagram showing the trench of the circuit module.

FIG. 17 is a schematic diagram showing a length of the trench 106, and the trench 206 overlapping the trench 106 is indicated by broken lines. As shown in the figure, by providing the second trench portion 106b, the length of the trench 106 (length seen in direction vertical to main surface 103a (Z direction)) can be made shorter than that of the circuit module 200. As a result, a time required for forming the trench 106 can be shortened, and the material of the inner shield portion 104a (shield material) formed inside the trench 106 can be saved.

In addition, when changing the extension direction of the trench 206 in the circuit module 200, the trench 206 needs to be bent orthogonally. Since the scanning direction of the laser for forming the trench 206 is bent orthogonally at the orthogonally-bent portion, the scanning stops instantaneously, and thus there is a fear that the surface layer conductor and the in-layer wiring below that will be damaged. In contrast, since there is no orthogonally-bent portion in the circuit module 100, the extension direction of the trench 106 can be changed without damaging the surface layer conductor 105 and the in-layer wiring.

What is claimed is:

1. A circuit module, comprising:
   a circuit substrate including a mount surface;
   a mounting component mounted on the mount surface;
   a sealing body that is formed on the mount surface, covers the mounting component, and includes a trench formed from a main surface of the sealing body toward the mount surface, the trench including a first trench portion extending in one of a parallel direction and an orthogonal direction with respect to a direction parallel to the main surface and a second trench portion that is connected to the first trench portion, is parallel to the main surface, and extends in a direction that is not parallel nor orthogonal to the first trench portion; and
   a shield that covers the sealing body and includes an inner shield portion formed inside the trench and an outer shield portion provided on the main surface and the inner shield portion,
   wherein a surface layer conductor is provided along the trench on the mount surface, and
   the trench reaches the surface layer conductor.

2. The circuit module according to claim 1,
   wherein the trench includes a plurality of first trench portions provided apart from each other, and
   wherein the second trench portion connects a gap between the plurality of first trench portions.

3. The circuit module according to claim 1,
   wherein the mounting component includes a plurality of mounting components, and
   wherein the trench is formed to separate the plurality of mounting components.

* * * * *